(12) United States Patent
Ogura et al.

(10) Patent No.: US 10,083,956 B2
(45) Date of Patent: Sep. 25, 2018

(54) SEMICONDUCTOR DEVICE

(71) Applicant: KABUSHIKI KAISHA TOSHIBA, Tokyo (JP)

(72) Inventors: Tsuneo Ogura, Kamakura, Kanagawa (JP); Tomoko Matsudai, Shibuya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/694,963

(22) Filed: Sep. 4, 2017

(65) Prior Publication Data

US 2018/0226398 A1 Aug. 9, 2018

(30) Foreign Application Priority Data

Feb. 3, 2017 (JP) .................. 2017-018529

(51) Int. Cl.
*H01L 29/06* (2006.01)
*H01L 29/66* (2006.01)
*H01L 27/06* (2006.01)
*H01L 21/324* (2006.01)
*H01L 29/739* (2006.01)
*H01L 29/40* (2006.01)
*H01L 29/10* (2006.01)
(Continued)

(52) U.S. Cl.
CPC ........ *H01L 27/0664* (2013.01); *H01L 21/762* (2013.01); *H01L 27/0635* (2013.01);
(Continued)

(58) Field of Classification Search
CPC ............. H01L 27/0664; H01L 27/0635; H01L 27/0761; H01L 29/868; H01L 29/407;
(Continued)

(56) References Cited

U.S. PATENT DOCUMENTS 8,405,122 B2 3/2013 Kouno et al.
8,686,467 B2 * 4/2014 Iwasaki ................. H01L 21/761
257/140
(Continued)

FOREIGN PATENT DOCUMENTS

JP 2010263149 A 11/2010
JP 4957840 B2 6/2012
(Continued)

*Primary Examiner* — Dao H Nguyen
(74) *Attorney, Agent, or Firm* — Patterson & Sheridan, LLP

(57) ABSTRACT

A semiconductor device includes first and second electrodes, a first semiconductor region between the first and second electrodes, a second semiconductor region between the first semiconductor region and the second electrode, a third semiconductor region between the first semiconductor region and the second electrode, a fourth semiconductor region between the first semiconductor region and the first electrode, a third electrode between the first electrode and the first semiconductor region, a first insulating film between the third electrode and both the first electrode and the first semiconductor region, a fifth semiconductor region between the fourth semiconductor region and the first electrode and in contact with the first electrode, a sixth semiconductor region between the fourth semiconductor region and the first electrode and in contact with the first electrode, and a seventh semiconductor region between the fourth semiconductor region and the first insulating film and in contact with the first semiconductor region.

20 Claims, 5 Drawing Sheets

(51) Int. Cl.
    *H01L 29/868* (2006.01)
    *H01L 21/762* (2006.01)
    *H01L 27/07* (2006.01)
(52) U.S. Cl.
    CPC ...... *H01L 27/0761* (2013.01); *H01L 29/0615* (2013.01); *H01L 29/1095* (2013.01); *H01L 29/407* (2013.01); *H01L 29/66325* (2013.01); *H01L 29/739* (2013.01); *H01L 29/7397* (2013.01); *H01L 29/868* (2013.01)
(58) Field of Classification Search
    CPC ............... H01L 29/739; H01L 29/0615; H01L 29/1095; H01L 29/7397; H01L 29/66325; H01L 21/331; H01L 21/762
    USPC .... 257/76, 77, 139, 140, 143, 331, E27.019, 257/E29.027, E29.197, E29.201, E21.382; 438/135, 138, 270
    See application file for complete search history.

(56) References Cited

U.S. PATENT DOCUMENTS

| | | | |
|---|---|---|---|
| 9,159,721 B2 | 10/2015 | Okawara et al. | |
| 9,159,722 B2 | 10/2015 | Ogura et al. | |
| 9,219,060 B2 * | 12/2015 | Ogura | H01L 29/7397 |
| 9,634,128 B2 | 4/2017 | Ogura et al. | |
| 9,761,582 B2 * | 9/2017 | Gejo | H01L 27/0664 |
| 2013/0248882 A1 | 9/2013 | Ogura et al. | |
| 2013/0260515 A1 * | 10/2013 | Mizushima | H01L 29/66325 |
| | | | 438/135 |
| 2015/0200247 A1 * | 7/2015 | Schmidt | H01L 29/66348 |
| | | | 257/140 |
| 2015/0263144 A1 * | 9/2015 | Misu | H01L 29/407 |
| | | | 257/139 |
| 2015/0263149 A1 | 9/2015 | Ogura et al. | |
| 2016/0079369 A1 | 3/2016 | Ogura et al. | |
| 2017/0186884 A1 * | 6/2017 | Ogura | H01L 29/868 |

FOREIGN PATENT DOCUMENTS

| | | |
|---|---|---|
| JP | 5083468 B2 | 11/2012 |
| JP | 2013201360 A | 10/2013 |
| JP | 2015195366 A | 11/2015 |
| JP | 2016058636 A | 4/2016 |
| JP | 5918288 B2 | 5/2016 |
| JP | 6003961 B2 | 10/2016 |
| JP | 6158058 B2 | 7/2017 |
| JP | 6158123 B2 | 7/2017 |
| WO | 2016072144 A1 | 5/2016 |

* cited by examiner

SEMICONDUCTOR DEVICE

CROSS-REFERENCE TO RELATED APPLICATION

This application is based upon and claims the benefit of priority from Japanese Patent Application No. 2017-018529, filed Feb. 3, 2017, the entire contents of which are incorporated herein by reference.

FIELD

Embodiments described herein relate generally to a semiconductor device.

BACKGROUND

As one high breakdown voltage (for example, 300 V or higher) power semiconductor element, an insulated gate bipolar transistor (IGBT) is known.

In most cases, the IGBT is used with backflow diodes being connected to each other in a reversely-parallel manner. Generally, there is a need to provide these diodes in another chip because the IGBT does not have diode regions that are arranged to be reversely in parallel with each other. As a semiconductor device in which an IGBT and diode are integrated, there is a reversely conductive-type IGBT. However, in the reversely conductive-type IGBT, injection of many holes occurs as a result of impurity elements that are implanted into a p type base region of the IGBT, and thus in some cases, it is difficult to further increase the switching speed of a diode.

DETAILED DESCRIPTION

Figure 1A:
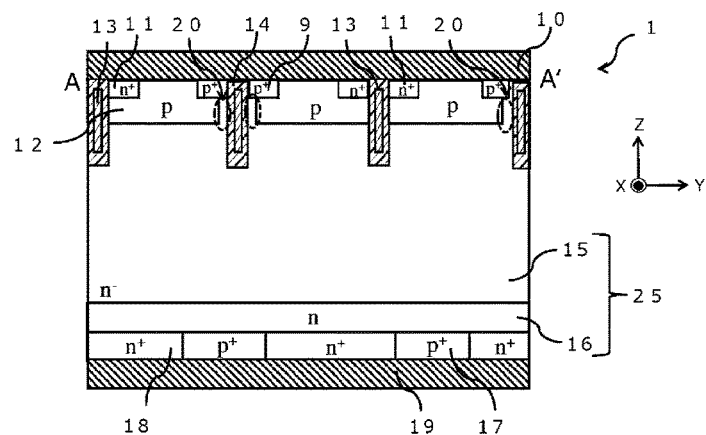
FIG. 1A is a schematic cross-sectional diagram illustrating a semiconductor device according to a first embodiment.

Embodiments provide a semiconductor device that is capable of improving the switching speed of a semiconductor device such as an IGBT.

In general, according to one embodiment, there is provided a semiconductor device including a first electrode, a second electrode, the first and second electrodes spaced from each other in a first direction, a first semiconductor region of a first conductivity type between the first electrode and the second electrode, a second semiconductor region of a second conductivity type between the first semiconductor region and the second electrode, a third semiconductor region of the first conductivity type between the first semiconductor region and the second electrode, wherein the third semiconductor region is adjacent to the second semiconductor region in a second direction orthogonal to the first direction, and has a higher first impurity type concentration than the first semiconductor region, a fourth semiconductor region of the second conductivity type between the first semiconductor region and the first electrode, a first insulating film between the first semiconductor region and the first electrode, a third electrode between the first electrode and the first semiconductor region, with a first insulating film interposed between the third electrode and the first electrode and the first semiconductor region, a fifth semiconductor region of the first conductivity type, between a portion of the fourth semiconductor region and the first electrode and in contact with the first electrode, a sixth semiconductor region of the second conductivity type between a portion of the fourth semiconductor region and the first electrode and in contact with the first electrode, wherein the sixth semiconductor region has a higher second conductivity type impurity concentration than the fourth semiconductor region, and a seventh semiconductor region of the first conductivity type between the fourth semiconductor region and the first insulating film and in contact with the first semiconductor region.

Embodiments will be described below with reference to the drawings. In the following description, like elements are given like reference numerals, and repetitious descriptions of the same element are suitably avoided.

It is noted that a relationship between the thickness and width of each component in the drawings, a ratio in size between components, and the like are not necessarily the same as those of an actual device. Furthermore, in some cases, even the same elements are expressed having different dimensions or different ratios among the drawings.

In the following description, notations, n+, n, n−, p+, and p, indicates relative high and low levels of impurity concentrations of the respective conductivity types. That is, the impurity concentration is indicated as being relatively high in this order: a region to which "+" is attached, a region to which any notation is not attached, a region to which "−" is attached. Furthermore, the expression "impurity concentration is high" may be replaced with the expression "carrier concentration is high".

Each embodiment that will be described herein may be implemented with the p type and n type regions of each semiconductor region being reversed.

First Embodiment

Figure 1B:
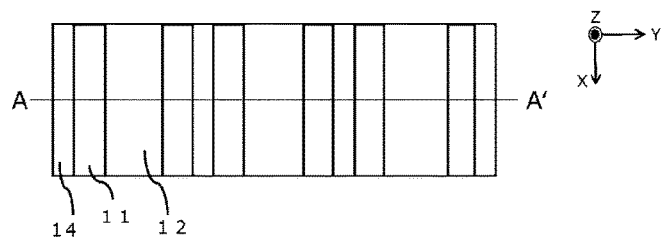
FIG. 1B is a schematic plan diagram taken along line A-A'.

A first embodiment of the present disclosure is described with reference to FIGS. 1A, 1B, 2A, and 2B. FIG. 1A is a schematic cross-sectional diagram taken along line A-A' of FIG. 1B illustrating a semiconductor device according to the first embodiment. FIG. 1B is a schematic plan view of the semiconductor device of FIG. 1A. A three-dimensional coordinate system (XYZ coordinate system) is introduced into the figures referred to for description, in order to express a direction with reference to the semiconductor device. The X direction and the Y direction are orthogonal to each other on the same plane. Furthermore, the Z direction is orthogonal to the X direction and to the Y direction.

The semiconductor device 1 according to the first embodiment has a vertical electrode structure. The semiconductor device 1 includes an emitter electrode 10 and a collector electrode 19. The direction from the collector electrode 19 to the emitter electrode 10 is the Z direction. It is noted that in the semiconductor device 1, an IGBT that functions as a transistor and a free wheeling diode (FWD) that functions as a backflow diode are integrated.

In the semiconductor device 1, an n− type semiconductor region 15 and an n type semiconductor region 16 (both of which together forma first semiconductor region 25) are provided between the emitter electrode 10 and the collector electrode 19. The n type semiconductor region 16 is positioned between the collector electrode 19 and the n− type semiconductor region 15 in the Z direction. It is noted that the n− type semiconductor region 15 may be considered to be an n− type base region and the n type semiconductor region 16 considered as an n type buffer region, in an exchanged manner.

A p+ type collector region 17 and an n+ type cathode region 18 are provided between the n type semiconductor region 16 and the collector electrode 19. Furthermore, the p+ type collector region 17 and the n+ type cathode region 18 are located adjacent to each other in the Y direction. The p+ type collector region 17 and the n+ type cathode region 18 electrically connect to the collector electrode 19.

In the Z direction, a p type base region 12 is provided between the n− type semiconductor region 15 and the emitter electrode 10. An n+ type emitter region 11 is provided between a portion of the p type base region 12 and the emitter electrode 10. The p type base region 12 and the n+ type emitter region 11 are both electrically connected to the emitter electrode 10.

In a diode operation, the emitter electrode 10 functions as an anode electrode and the collector electrode 19 functions as a cathode electrode.

Furthermore, a gate electrode 13 is in located adjacent to, and spaced from, the n− type semiconductor region 15, the p type base region 12, and the n+ type emitter region 11, by a gate insulating film 14 located therebetween.

The gate electrode 13 extends in the X direction and the Z direction. Furthermore, a plurality of gate electrodes 13 are provided spaced from each other in the Y direction. The structure of the gate electrode 13 that is illustrated in FIG. 1A is a so-called trench gate structure, but the gate electrode 13 may be a planar type.

The semiconductor device 1 has a narrowed n type channel region 20 that extends between at least a part of the p type base region 12 and the gate insulating film 14. In the present embodiment, the n type semiconductor region which is interposed between the p type base region 12 and the gate insulating film 14 is defined as the narrowed n type channel region 20. That is, the narrowed n type channel region 20 is positioned, in the Y direction, between the p type base region 12 and the gate insulating film 14. Furthermore, the narrowed n type channel region 20 is in contact with, and extends in the z-direction from, the n− type semiconductor region 15. The narrowed n type channel region 20 and the n− type semiconductor region 15 may be collectively defined as the n− type semiconductor region 15, without the narrowed n type channel region 20 being regarded as a part of the n− type semiconductor region 15. Additionally, a p+ type contact region 9 is formed between the narrowed n type channel region 20 and the emitter electrode 10. That is, the narrowed n type channel region 20 is located, in the Z direction, between the n− type semiconductor region 15 and the p+ type contact region 9. Accordingly, the narrowed n type channel region 20 is bounded by the p+ type contact region 9, the p type base region 12, and the gate insulating film 14 over the gate electrode 13.

Furthermore, although not illustrated, a gate electrode 13 that is interposed between p+ type contact regions 9 and narrowed n type channel regions 20 in the Y direction does not function as a gate and thus, may be connected to the emitter electrode 10. In this construct, the total gate capacitance can be reduced, which is advantageous for an increase in speed.

An example of a material of each constituent element is described.

For example, a main component of each of the plurality of semiconductor regions that are provided between the collector electrode 19 and the emitter electrode 10 is silicon (Si). The main component of each of the plurality of semiconductor regions may also be silicon carbide (SiC), gallium nitride (GaN), or the like. As an impurity element that is of a conductivity type, such as an n+ type, an n type, or an n− type, for example, phosphorus (P), arsenic (As), or the like is used. As an impurity element that is of a conductivity type, such as a p+ type, a p type, or the like, for example, boron (B) or the like is used. Furthermore, in the semiconductor device 1, the conductivity types that are a p type and an n type can be switched for implantation, and the same effect is obtained.

Each of the material of the collector electrode 19 and the material of the emitter electrode 10, for example, is a metal that includes at least one metal which is selected from a group of aluminum (Al), titanium (Ti), nickel (Ni), tungsten (W), gold (Au), and the like. Materials of each of the gate electrode 13 and an emitter potential electrode 23, for example, include polysilicon. Furthermore, materials of an insulating film, for example, include silicon oxide, silicon nitride, and the like.

Operations and Effects

Operations and effects according to the present embodiment are described here with reference to FIGS. 1A to 3.

Operations of the semiconductor device 1 according to the first embodiment are described.

Figure 2A:
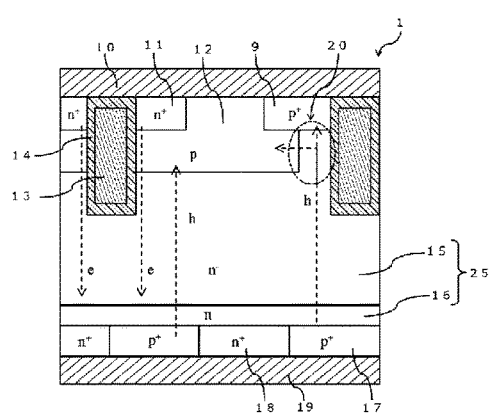
FIGS. 2A and 2B are schematic cross-sectional diagrams illustrating an ON state of the semiconductor device according to the first embodiment.
Figure 2B:
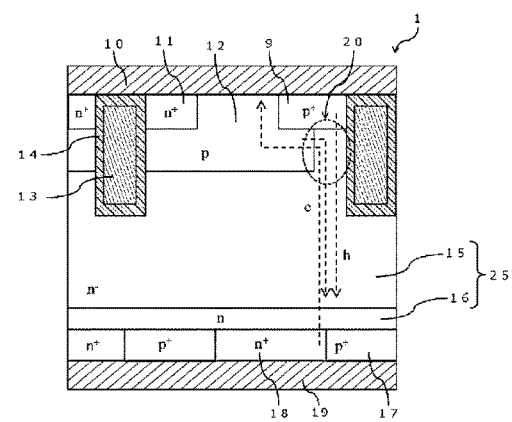

FIGS. 2A and 2B are schematic cross-sectional diagrams illustrating an ON state of the semiconductor device 1 according to the first embodiment.

Operations in an ON state of an IGBT unit and an ON state of a FWD unit are described with reference to FIG. 2. In the semiconductor device 1, the IGBT unit and the FWD unit are integrated. Thus, for the purpose of description, the functional portions of the device are referred to as the IGBT unit and the FWD unit, respectively.

First, operation of the IGBT unit in the semiconductor device 1 described with reference to FIG. 2A. FIG. 2A is a schematic cross-sectional diagram illustrating operation that results when the IGBT unit is in the ON state.

Higher potential is applied to the collector electrode 19 than to the emitter electrode 10, and a potential equal to or higher than threshold potential Vth is supplied to the gate electrode 13. In this case, an n type channel region is formed on the surface of the p type base region 12 along the gate insulating film 14, and the IGBT unit is in the ON state. More precisely, an electron current e flows from the n+ type emitter region 11 to the p type base region 12, the n− type base region 15, the n type buffer region 16, and the p+ type collector region 17 in this order. Likewise, a hole current h flows from the p+ type collector region 17 to the n type buffer region 16, the n− type base region 15, and the p type base region 12 in this order.

In the FWD unit, portions of the semiconductor regions 16 and 18 are considered as an n type cathode region, a portion of the semiconductor region 15 as an intrinsic region, and the electrode 10 as an anode electrode 10 and electrode 19 as a cathode electrode 19 in a switched, and thus a PIN diode which includes the anode electrode 10, an anode region (which is the p type base region) 12, an intrinsic region 15, cathode regions 16 and 18, and a cathode electrode 19 is formed. While the IGBT unit is in the ON state, because higher potential is applied to the anode electrode 10 than to the cathode electrode 19, with respect to the PIN diode of the FWD unit, a reverse bias voltage is applied. Accordingly, current does not flow through the FWD unit.

At this point, because the narrowed n type channel region 20 is an n type semiconductor region, the hole current h is divided into a component that flows directly into the p type base region 12, a component that flows into the p type base region 12 through the narrowed n type channel region 20, and a component that flows into the p+ type contact region 9 through the narrowed n type channel region 20.

Next, operation of the FWD unit in the semiconductor device 1 is described with reference to FIG. 2B. FIG. 2B is a schematic cross-sectional diagram illustrating operation that results when the FWD unit is in the ON state.

Generally, immediately before the IGBT unit enters the ON state, regenerative current flows within the PIN diode of the FWD unit and the PIN diode operates as the backflow diode. While the backflow diode operates, the bias voltage is temporarily applied in the forward direction between a cathode and an anode.

The n+ type cathode region 18 is in an ohmic contact with the cathode electrode 19. Therefore, the electron current e flows from the n+ type cathode region 18 through the first semiconductor region 25 and the p type base region 12 and then into the anode electrode 10. The potential of the narrowed n type channel region 20 is lower than that of the p type base region 12. Therefore, the electrons flow into the narrowed n type channel region 20. Additionally, the p+ type contact region 9 has a higher p type impurity concentration than does the p type base region 12. Therefore, the potential of the p type base region 12 becomes lower than that of the p+ type contact region 9. As a result, in a lower portion of the p+ type contact region 9, the electrons flow to the p type base region 12 side. Accordingly, an electron current e is formed between the cathode electrode (e.g., the collector electrode 19) and the anode electrode (e.g., the emitter electrode 10).

That is, when the electrons flow in the direction from the cathode electrode (e.g., the collector electrode 19) side to the anode electrode (e.g., the emitter electrode 10) side and reach the vicinity of the p+ type contact region 9, the electrons move in the horizontal direction, that is, in the direction that is approximately in parallel with the Y direction. With this movement of the electrons, the portion of the p+ type contact region 9 in contact with the anode electrode (e.g., the emitter electrode 10) becomes a positive electrode, and the narrowed n type channel region 20 that is positioned under an anode region 21 becomes a negative electrode with respect to the p+ type contact region 9. With bias on the positive electrode and the negative electrode, an energy barrier with respect to holes between the p+ type contact region 9 and the narrowed n type channel region 20 is lowered. Accordingly, holes are injected from the p+ type contact region 9 to the narrowed n type channel region 20, and flow toward the cathode electrode (e.g., the collector electrode 19). It is noted that the holes are also injected from the p type base region 12, but because the p type base region 12 has a relatively low p type impurity concentration as compared to that of the p+ type contact region 9, the amount of the injected holes from the p type base region 12 is smaller than that from the p+ type contact region 9. The injected holes form the whole current h in the semiconductor device 1. In this manner, in the FWD unit in the ON state, holes flow from the anode electrode (e.g., the emitter electrode 10) side to the cathode electrode (e.g., the collector electrode 19) side, and electrons flow from the cathode electrode (e.g., the collector electrode 19) side to the anode electrode (e.g., the emitter electrode 10) side.

The hole current h increases if the width of the p+ type contact region 9 in the Y direction or a contact area between the p+ type contact region 9 and the anode electrode 10 is increased. An amount of holes injected from the anode side is adjusted by adjusting the width or the contact area of the p+ type contact region 9 and the p type impurity concentration thereof compared to that of the p type base region 12.

At this point, as described above, under the anode electrode (e.g., the emitter electrode 10), the amount of holes injected from the p type base region 12 with the relatively lower impurity concentration is small, but an amount of holes injected from the p+ type contact region 9 with the higher concentration is large. However, the narrowing of the width of the p+ type contact region 9 can reduce the amount of hole injection from the p+ type contact region 9. Furthermore, in the FWD unit, in the Y direction, it is easy to modify the region where the p+ type contact region 9 is provided and the region where the p+ type contact region 9 is not provided. Accordingly, the contact area between the p+ type contact region 9 and the anode electrode 10 can be decreased. The decrease in the contact area reduces the amount of holes injected from the anode side in operation of the FWD. Because the amount of injected holes can be reduced as described above, the recovery speed becomes high.

Figure 3:
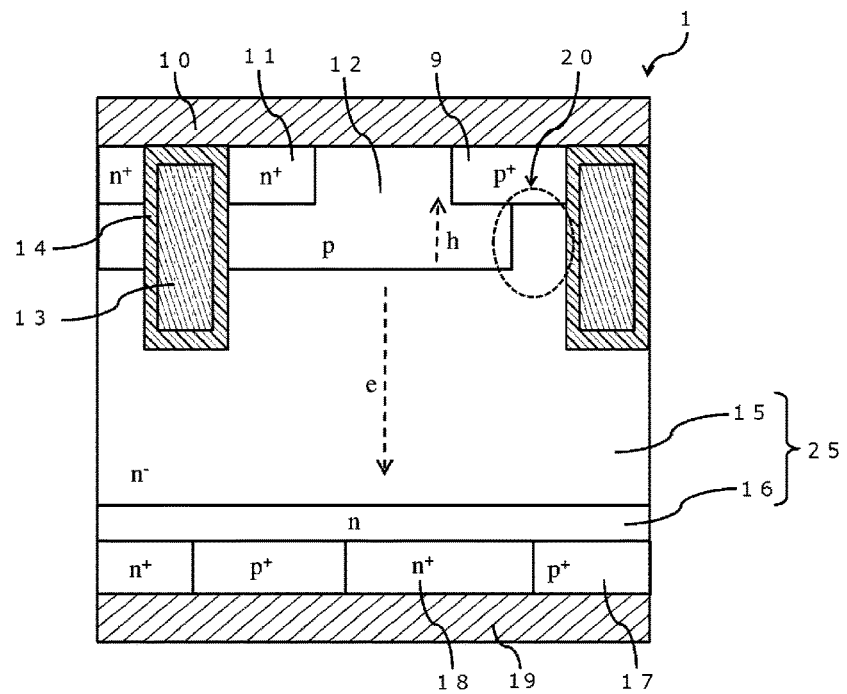
FIG. 3 is a schematic cross-sectional diagram illustrating a recovery state of an FWD region of the semiconductor device according to the first embodiment.

FIG. 3 is a schematic cross-sectional diagram illustrating a recovery state of the FWD unit of the semiconductor device according to the first embodiment.

When the FWD unit is in the recovery state, the IGBT unit is in an OFF state.

FIG. 3 illustrates a state where the voltage between the anode and the cathode is a reverse bias. More precisely, a voltage is applied between the cathode and the anode in such a manner that the anode electrode 10 is a negative electrode and the cathode electrode 19 is a positive electrode.

In a state where forward bias is applied between the anode and the cathode, where reverse bias is then applied between the anode and the cathode, holes that are present in the first semiconductor region 25 move toward the anode electrode 10 side of the device. Furthermore, electrons that are present in the first semiconductor region 25 move toward the cathode electrode 19 side of the device.

When a reverse bias is applied to the device, electrons flow into the cathode electrode 19 through the cathode region 18, and holes flow into the anode electrode 10 through the anode region (which is the p type base region) 12.

At the time of the recovery, while the electron current e is flowing through the cathode electrode 19 and the hole current h is flowing through the anode electrode 10, a depletion region grows from the junction of the anode region 12 with the first semiconductor region 25. Accordingly, in the FWD unit, conduction between the anode electrode 10 and the cathode electrode 19 is gradually reduced and eventually prevented.

At this time, the smaller the number of carriers in the vicinity of the junction portion of the anode region 12 with the first semiconductor region 25, the more easily the depletion region is increased in size and the higher the speed at which a voltage increases. For this reason, as described above, with the structure of the p type base region 12, the narrowed n type channel region 20, and the p+ type contact region 9, the reduction in the amount of injected holes can increase the speed of the resulting increase in voltage.

On the other hand, when a positive bias voltage is applied to the gate electrode 13 in order to cause the anode electrode 10 and the cathode electrode 19 of the IGBT to become electrically connected, an n type channel region needs to be formed on a surface of the p type base region 12 of the IGBT. For this reason, if the structure in which the p type base region 12, the narrowed n type channel region 20, and the p+ type contact region 9 are combined, which is disclosed in the present application, is not employed, a large amount of holes are injected into the n– type base region 15 from the p type base region 12, and thus it becomes difficult to increase the switching speed of the device.

In contrast, as described with reference to FIGS. 2A and 2B, with the semiconductor device 1 according to the first embodiment, electrons that are injected from the n+ type cathode region 18 in a conductive state of the FWD flow into the anode electrode 10 through the narrowed n type channel region, without entering the portion of the p type base region 12 of the IGBT directly over the first semiconductor region 25. Accordingly, holes can be suppressed from being injected from the p type base region 12 into the first semiconductor region 25, and the increase in speed of the FWD can be realized. In this manner, according to the exemplary embodiment of the present disclosure, an IGBT region can also be used as the FWD, and an IGBT and a FWD can be easily integrated.

Next, operation of the semiconductor device according to a reference example is described.

Figure 4:
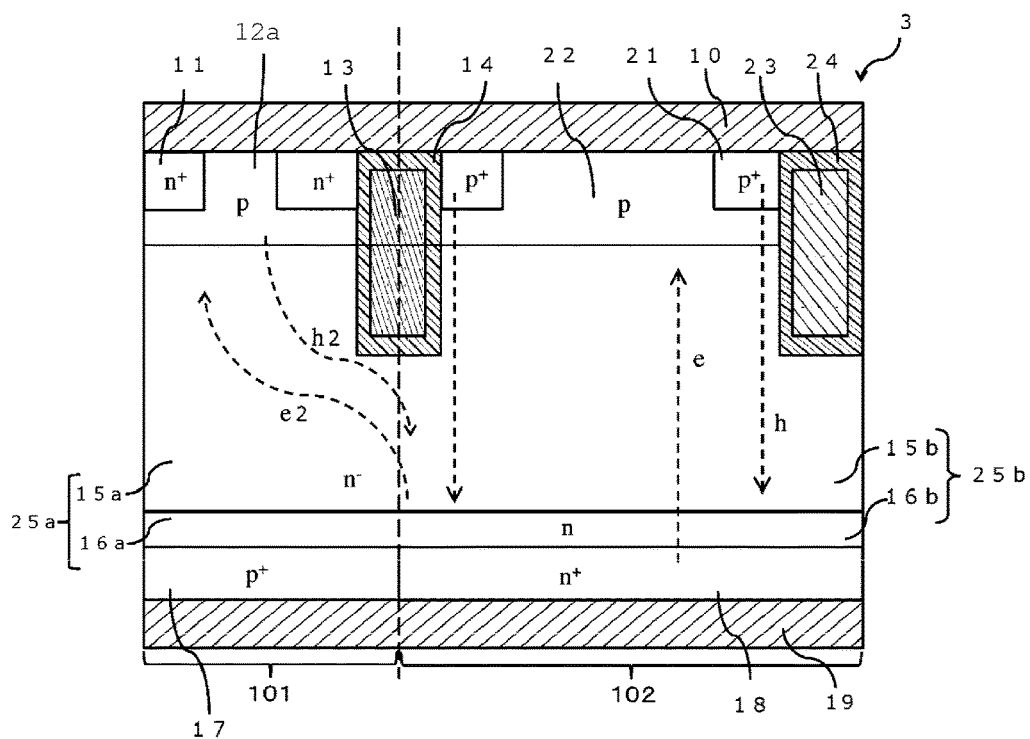
FIG. 4 is a schematic cross-sectional diagram illustrating operation of a semiconductor device according to a first reference example.

FIG. 4 is a schematic cross-sectional diagram illustrating operation of a semiconductor device 3 according to a first reference example.

The semiconductor device 3 has an IGBT region 101 and a FWD region 102, and has a structure in which the IGBT region 101 and the FWD region 102 are in direct contact with each other.

FIG. 4 illustrates a state where the PIN diode of the FWD region 102 functions as the backflow diode. In this case, in the FWD region 102, the electron current e flows from the cathode side to the anode side, and the hole current h flows from the anode side to the cathode side.

In the meantime, a state where the potential of the cathode electrode 19 is higher than the potential of the anode electrode 10 occurs temporarily. At this point, the cathode electrode 19 and the anode electrode 10 are shared by the IGBT region 101 and the FWD region 102.

Therefore, a forward bias voltage is also applied to a parasitic diode (formed by the p type base region 12a and the n– type base region 15a) in the IGBT region 101, and holes are injected from the p type base region 12a into the n– type base region 15a.

Furthermore, an n+ type cathode region 18 having a high n-type impurity concentration is adjacent to the p type collector region 17. Thereover, the IGBT region 101 and the FWD region 102 are in direct contact with each other. For this reason, electrons e2 that are emitted from the n+ type cathode region 18 are diffused into the IGBT region 101.

Then, when the electrons that are diffused from the n+ type cathode region 18 into the IGBT region 101 form a charge which exceed an energy barrier at the parasitic diode (the p type base region 12a and the n– type base region 15a), holes are injected from the p type base region 12a into the n– type base region 15a.

In this manner, holes are diffused into the IGBT region 101. In FIG. 4, the holes that are diffused from the p type base region 12a of the IGBT into the FWD region 102 are expressed holes h2. Accordingly, when the PIN diode is conductive, carriers are diffused into the IGBT region 101.

On the other hand, in a case where the PIN diode in the FWD region 102 is turned off, a state where reverse bias is applied to the PIN diode of the FWD region 102 is reached.

In this case, a voltage is applied between the cathode and the anode in such a manner that the anode electrode 10 is a negative electrode and the cathode electrode 19 is a positive electrode. That is, in the FWD region 102, holes that are present in the second portion 25b of the first semiconductor region 25 move to the anode electrode 10 side of the device and electrons that are present in the second portion 25b of the first semiconductor region 25 move to the cathode electrode 19 side of the device.

Furthermore, under these conditions, holes that are present in a first portion 25a of the first semiconductor region 25 of the IGBT region 101 are discharged to the emitter electrode 10 through the p-type base region 12a.

In this manner, in the semiconductor device 3, before and after a recovery operation, not only do carriers stay in the FWD region 102, but the carriers also stay in the IGBT region 101. Accordingly, there is a problem in that a limitation is imposed on an increase in the recovery speed of the PIN diode.

Figure 5:
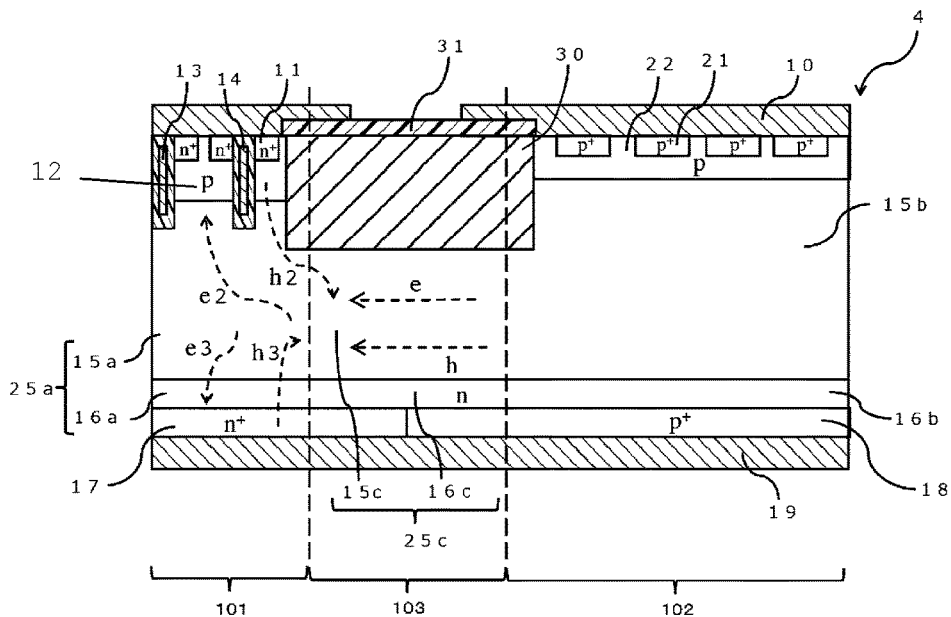
FIG. 5 is a schematic cross-sectional diagram illustrating operation of a semiconductor device according to a second reference example.

FIG. 5 is a schematic cross-sectional diagram illustrating operation of a semiconductor device according to a second reference example.

A separation region 103 is provided in the semiconductor device 4 between the IGBT region 101 and the diode region 102 of the device as illustrated in FIG. 5. A relatively thick p+ type eighth semiconductor region 30 in the Z direction is provided in the separation region 103. The eighth semiconductor region 30 extends from the anode electrode 10 side of the device toward the cathode electrode 19 side of the device. An insulating region 31 is provided between portions of the eighth semiconductor region 30 and the anode electrode 10.

The eighth semiconductor region 30 and the anode electrode 10 are electrically separated from each other in the separation region. At least a part of the eighth semiconductor region 30 contacts the third portion 25c of the first semiconductor region 25. The depth of the eighth semiconductor region 30 extending inwardly of the anode 10 side of the device is greater than the depth of the gate insulating film 14.

Furthermore, the p type collector region 17 and the cathode region 18 are disposed adjacent to each other in the separation region 103.

The provision of the separation region 103 keeps the IGBT region 101 and the FWD region 102 separated by a distance from each other. Therefore, when the PIN diode in the FWD region 102 is turned on, although holes are injected from a p type base region 12 of the IGBT, these holes h easily recombine with electrons. Accordingly, when compared with the first reference example, in a FWD state, the number of carriers that are accumulated in the n− type base region can be reduced and an increase in speed is possible.

However, due to the creation of the separation region, a region that does not contribute to conduction between the emitter 10 and collector 19 results, and this region cannot be effectively used in the IGBT.

In contrast, in the semiconductor device 1, the IGBT and the diode are integrated, and a part of the p type base region 12 that is formed between trenches of the IGBT is the narrowed n type channel region 20, and the p+ type contact region 9 is formed on the narrowed n type channel region 20.

With this structure, in the conductive state of the FWD, electrons that are injected from an n+ cathode region 18 flow into the anode electrode 10 through the narrowed n type channel region 20 and then through the p type base region 12, without entering the p type base region 12 of the IGBT along the interface of the p type base region 12 and the first semiconductor region 25. Accordingly, holes formation is suppressed, as is hole injection from the p type base region 12 into the first semiconductor region 25, and the increase in speed of the FWD can be realized.

First Modification Example of the First Embodiment

Figure 6A:
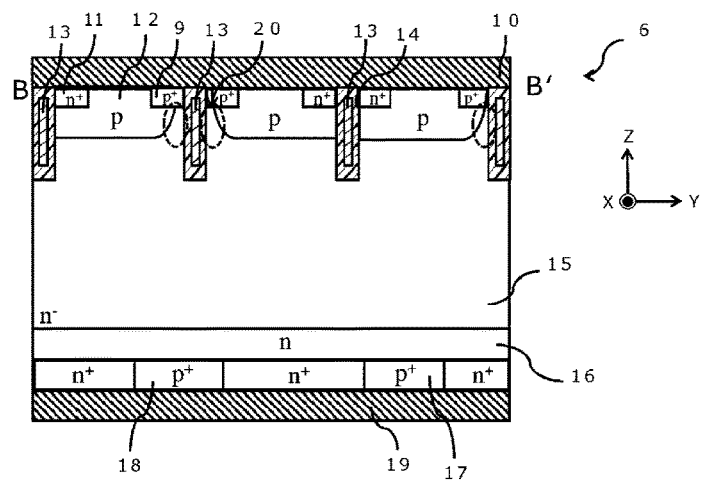
FIG. 6A is a schematic cross-sectional diagram illustrating a semiconductor device according to a first modification example of the first embodiment.
Figure 6B:
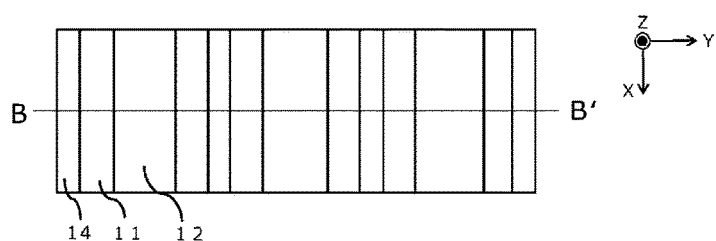
FIG. 6B is a schematic plan diagram taken along line B-B'.

A first modification example of the first embodiment is illustrated in FIGS. 6A and 6B. FIG. 6A is a schematic cross-sectional view of the semiconductor device FIG. 6B taken along line B-B' illustrating a semiconductor device according to the first modification example of the first embodiment. FIG. 6B is a schematic plan view of the semiconductor device of FIG. 6A. A difference as compared with the first embodiment is that in the p base regions 12, as it comes closer to the p+ type contact region 9, the corner of at least one or more of the p base regions 12 take the form of a gradual curve. This can be easily formed by diffusion of impurities in the horizontal direction where the p base region 12 is formed by a diffusion method. With this structure, it is possible to reduce the p layer impurity concentration in the narrowed n type channel region 20 side of the p base region 12 without exerting any influence on a channel region of the IGBT, and holes can be suppressed from being injected from the p type base region 12 of the IGBT at the time of the operation of the FWD. Because of this, the increase in the switching speed of the diode is possible.

Second Modification Example of the First Embodiment

Figure 7A:
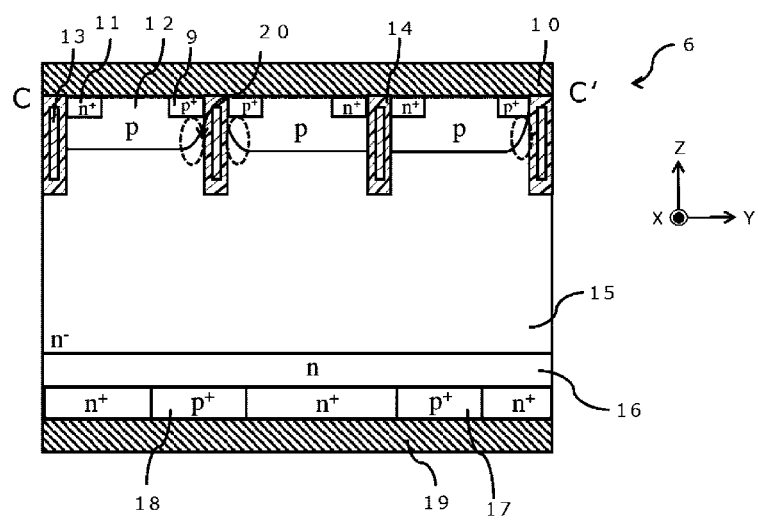
FIG. 7A is a schematic cross-sectional diagram illustrating a semiconductor device according to a second modification example of the first embodiment.
Figure 7B:
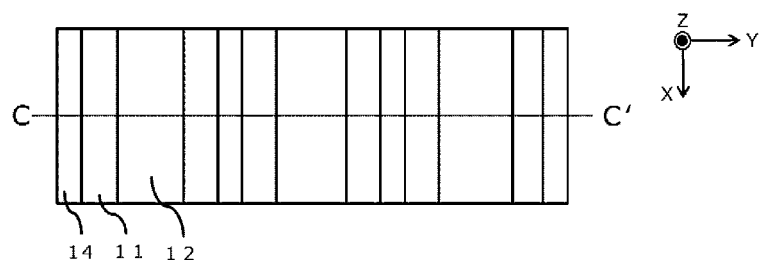
FIG. 7B is a schematic plan diagram taken along line C-C'.

A second modification example of the first embodiment is illustrated in FIGS. 7A and 7B. FIG. 7A is a schematic cross-sectional diagram taken along line C-C' of FIG. 7B illustrating a semiconductor device according to the second modification example of the first embodiment. FIG. 7B is a schematic plan view of the semiconductor device of FIG. 7A. A difference from the first modification example is that the p+ type contact region 9 is covered with a gradually curved portion of the p type base region 12. The n type channel region 20 is not formed by lowering an impurity concentration of the p type base region 12. In the same manner as in the first embodiment of the present disclosure, because the holes can be suppressed from being injected the lower portion of the p type base region 12 of the IGBT, the increase in the switching speed of the diode is possible.

Second Embodiment

Figure 8A:
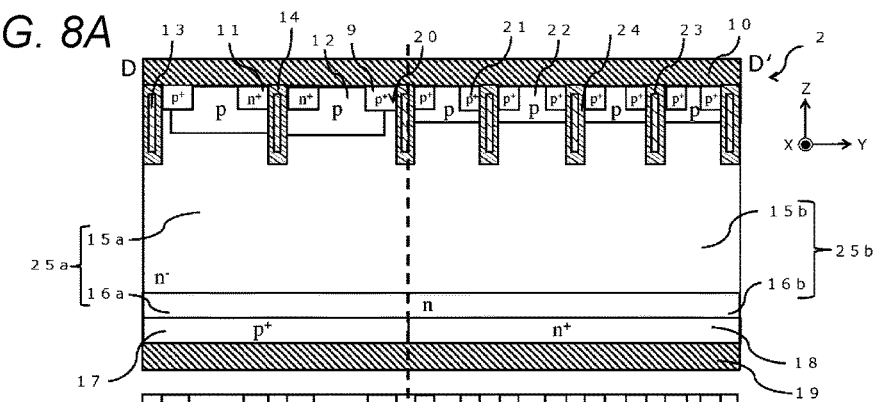
FIG. 8A is a schematic cross-sectional diagram illustrating a semiconductor device according to a second embodiment.
Figure 8B:
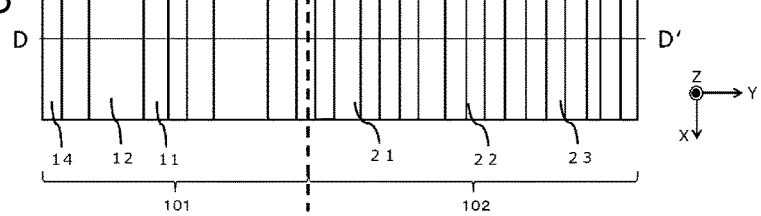
FIG. 8B is a schematic plan diagram taken along line D-D'.

Next, a second embodiment is described. FIG. 8A is a schematic cross-sectional diagram illustrating a semiconductor device according to the second embodiment taken along line D-D' of FIG. 8B. FIG. 8B is a schematic plan diagram of the semiconductor device of FIG. 8A.

A semiconductor device 2 according to the second embodiment is a semiconductor device that has a vertical electrode structure. The semiconductor device 2 includes the emitter electrode 10, the collector electrode 19, the IGBT region 101 and the FWD region 102. In the semiconductor device 2, the IGBT region 101 as a transistor and the FWD region 102 as a backflow diode are directly connected to each other.

In the semiconductor device 2, an n− type semiconductor region 15 and an n type semiconductor region 16 are provided between the emitter electrode 10 and the collector electrode 19. The n type semiconductor region 16 is positioned between the collector electrode 19 and the n− type semiconductor region 15. An impurity concentration of the semiconductor region 16 is higher than an impurity concentration of the semiconductor region 15.

The semiconductor region 15 is positioned to be shared between the IGBT region 101 and the FWD region 102. The semiconductor region 15 has a portion 15a that is provided in the IGBT region 101, and a portion 15b that is provided in the FWD region 102.

The semiconductor region 16 is positioned to be shared between the IGBT region 101 and the FWD region 102. The semiconductor region 16 has a portion 16a that is provided in the IGBT region 101, and a portion 16b that is provided in the FWD region 102. In the embodiment, a combination of the semiconductor region 15 and the semiconductor region 16 that are of the same conductivity type is defined as the first semiconductor region 25.

Therefore, a combination of the portion 15a of the semiconductor region 15 and the portion 16a of the semiconductor region 16 is defined as the first portion 25a of the first semiconductor region 25. A combination of the portion 15b of the semiconductor region 15 and the portion 16b of the semiconductor region 16 is defined as the second portion 25b of the first semiconductor region 25.

At this point, the IGBT region has a configuration as illustrated in FIG. 1.

Next, the FWD region 102 is described.

In the FWD region 102, the second portion 25b of the first semiconductor region 25 is provided between the cathode electrode 19 and the anode electrode 10. The n+ type cathode region 18 is provided between the second portion 25b of the first semiconductor region 25 and the cathode electrode 19. The n+ type cathode electrode 18 is in contact with the cathode electrode 19. An impurity concentration of the cathode region 16b is higher than an impurity concentration of the first semiconductor region 25.

The p type anode region 22 is provided between the second portion 25b of the first semiconductor region 25 and the anode electrode 10. A portion of the anode region 22 is in contact with the anode electrode 10. This portion of the anode region 22 is in Schottky contact with the anode electrode 10 or is in low resistance contact with the anode electrode 10.

The p+ type anode region 21 is selectively provided between the anode electrode 10 and portions of the anode region 22. The anode region 21 extends in the Z direction. A plurality of anode regions 21 are arranged in the Y direction. The anode region 21 is in contact with the anode electrode 10. The anode region 21 is in ohmic contact with the anode electrode 10. An impurity concentration of the anode region 21 is higher than an impurity concentration of the anode region 22. It is noted that the anode region 21 may be removed from the semiconductor device 1. For example, a structure that results from removing the anode region 21 in a structure that is illustrated in FIGS. 7A and 7B fall within the scope of the embodiment.

Furthermore, in the FWD region 102, the portion 16b of the n type buffer region 16 may considered as an n type buffer region 16b, the portion 15b of the base region 15 as an intrinsic region 15b, the anode electrode 10 as the cathode electrode 19, and the cathode electrode 19 as the anode electrode 10, in an exchanged manner.

Furthermore, in the FWD region 102, the emitter potential electrode 23 that is in electrical contact with the anode electrode 10 is provided. The emitter potential electrode 23 is spaced from the second portion 25b of the first semiconductor region 25, the anode region 22, and the anode region 21 by the insulating film 24. The emitter potential electrode 23 extends from the anode electrode 10 side to the cathode electrode 19 side, and extends in the X direction. A plurality of emitter potential electrodes 23 are arranged in the Y direction.

In this manner, in the FWD region 102, the PIN diode that includes the anode electrode, the anode region, the intrinsic region, the cathode region, and the cathode electrode is provided.

At this point, operations and effects according to the second embodiment are described with a focus on differences with those according to the first embodiment and the comparative example.

The difference from the first embodiment is that because the IGBT region and the FWD region are separated from each other, the FWD can be designed independently of the IGBT. Accordingly, the speed of the FWD can be further increased. In addition, the connection of a trench electrode of the FWD region to the cathode electrode can reduce the gate capacitance. Furthermore, in comparison with the comparative example, a carrier is suppressed from staying in the FWD region before and after the recovery operation, and because there is no need to form the region, an element area can be effectively utilized.

Modification Example of the Second Embodiment

Figure 9A:
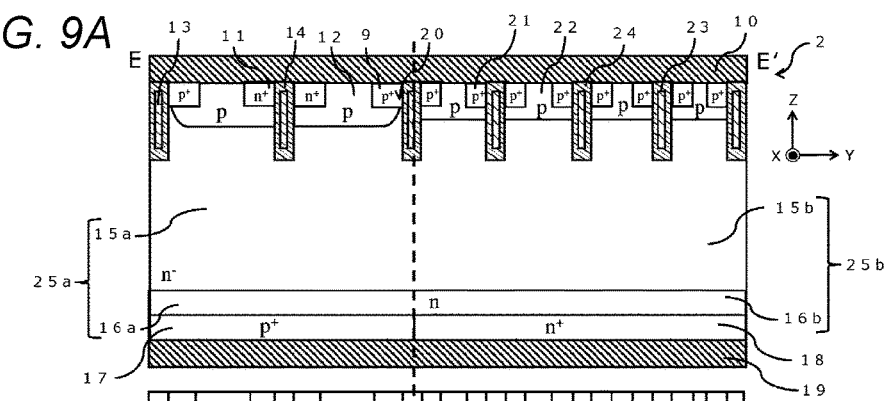
FIG. 9A is a schematic cross-sectional diagram illustrating a semiconductor device according to a first modification example of the second embodiment.
Figure 9B:
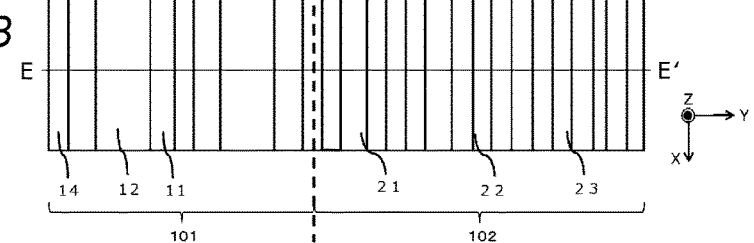
FIG. 9B is a schematic plan diagram taken along line E-E'.

A modification example of the second embodiment of the present disclosure is illustrated in FIGS. 9A and 9B. FIG. 9A is a schematic cross-sectional diagram illustrating a semiconductor device according to the modification example of the second embodiment taken along line E-E' of FIG. 9B. FIG. 9B is a schematic plan diagram of the semiconductor device of FIG. 9A. A difference with the second embodiment is that as the p type base region 12 becomes closer to the p+ type contact region 9, at least one or more of the p type base regions 12 take the form that results from drawing a gradual curve. Although the narrowed n type channel region 20 is not formed, an injection depth of the p type base region 12 is adjusted and thus holes can be suppressed from being injected from the p type base region of the IGBT in the same manner as in the second embodiment of the present disclosure. Because of this, the increase in the switching speed of the diode is possible.

It is noted that the FWD structure in the second embodiment is specifically described, but that the IGBT structure 101 according to the exemplary embodiment of the present disclosure, of course, can be integrated with other FWD structures and in such a case, can contribute to the increase in the speed of the FWD as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. Specific configuration of each of the elements included in the embodiments may be chosen from the art that is known to one skilled artisan. The accompanying claims and their equivalents are intended to cover such forms or modifications as would fall within the scope and spirit of the inventions.

What is claimed is:

1. A semiconductor device, comprising:
a first electrode;
a second electrode, the first and second electrodes spaced from each other in a first direction;
a first semiconductor region of a first conductivity type between the first electrode and the second electrode;
a second semiconductor region of a second conductivity type between the first semiconductor region and the second electrode;
a third semiconductor region of the first conductivity type between the first semiconductor region and the second electrode, wherein the third semiconductor region is adjacent to the second semiconductor region in a second direction orthogonal to the first direction, and has a higher first impurity type concentration than the first semiconductor region;
a fourth semiconductor region of the second conductivity type between the first semiconductor region and the first electrode;
a first insulating film between the first semiconductor region and the first electrode;
a third electrode between the first electrode and the first semiconductor region, with the first insulating film interposed between the third electrode and the first electrode and the first semiconductor region;
a fifth semiconductor region of the first conductivity type, between a portion of the fourth semiconductor region and the first electrode and in contact with the first electrode;
a sixth semiconductor region of the second conductivity type between a portion of the fourth semiconductor region and the first electrode and in contact with the first electrode, wherein the sixth semiconductor region has a higher second conductivity type impurity concentration than the fourth semiconductor region; and
a seventh semiconductor region of the first conductivity type between the fourth semiconductor region and the first insulating film and in contact with the first semiconductor region.

2. The semiconductor device according to claim 1, further comprising:
a first element region including the second semiconductor region and the seventh semiconductor region; and
a second element region including the third semiconductor region and not including the fifth semiconductor region, between the fourth semiconductor region and the first electrode, wherein the first element region and the second element region are directly adjacent to each other.

3. The semiconductor device according to claim 2, wherein the sixth semiconductor region contacts the fourth semiconductor region, the seventh semiconductor region and the first insulating film and is between a portion of the fourth semiconductor region and the first insulating film in the second direction.

4. The semiconductor device according to claim 1, wherein a pair of sixth semiconductor regions are adjacent to the first insulating layer in the second direction, and the first insulating layer in the second direction, and the first insulating layer is between the pair of sixth semiconductor regions in the second direction.

5. The semiconductor device according to claim 1, wherein a pair of seventh semiconductor regions are adjacent to a second insulating layer in the second direction and the second insulating layer is disposed between seventh semiconductor regions in the second direction.

6. The semiconductor device according to claim 5, further comprising:
a fourth electrode extending within the second insulating layer.

7. The semiconductor device according to claim 6, wherein the fourth electrode is electrically connected to the first electrode.

8. The semiconductor device according to claim 1, wherein the width of the seventh semiconductor region in the second direction decreases in the first direction in the direction from the second electrode to the first electrode.

9. A semiconductor device, comprising:
a first electrode;
a second electrode spaced from the first electrode;
a first semiconductor region of a first conductivity type interposed between the first and second electrodes;
a second semiconductor region of a second conductivity type interposed between the first semiconductor region and the first electrode, wherein a portion of the second semiconductor region contacts the first electrode;
a third semiconductor region of the first conductivity type interposed between the first electrode and a portion of the second semiconductor region;
at least two third electrodes between the first and second electrodes;
a fourth semiconductor region of the second conductivity type interposed between the first electrode and a portion of the second semiconductor region, wherein the portion of the second semiconductor region contacting the first electrode extends between the third and fourth semiconductor regions; and
a fifth semiconductor region of the first conductivity type bounded by the second semiconductor region, a first of the third electrodes, and the first semiconductor region.

10. The semiconductor device according to claim 9, wherein the fifth semiconductor region is further bounded by the fourth semiconductor region.

11. The semiconductor device of claim 9, wherein the impurity concentration of the second conductivity type impurity in the fourth semiconductor region is greater than impurity concentration of the second conductivity type impurity in the second semiconductor region.

12. The semiconductor device according to claim 9, further comprising:
a sixth semiconductor region of the first conductivity type interposed between the first semiconductor region and the second electrode; and
a seventh semiconductor region of the second conductivity type interposed between the first semiconductor region and the second electrode.

13. The semiconductor device according to claim 12, wherein the sixth and seventh semiconductor regions contact each other at a location between the second semiconductor region and the second electrode.

14. The semiconductor device according to claim 12, wherein the sixth and seventh semiconductor regions contact each other at a location between the second of the third electrodes and the second electrode.

15. A semiconductor device, comprising:
a first electrode;
a second electrode, the first and second electrodes spaced from each other is a first direction;
a first semiconductor region of a first conductivity type between the first electrode and the second electrode;
a second semiconductor region of a second conductivity type between the first semiconductor region and the second electrode;
a third semiconductor region of the first conductivity type which has a higher impurity concentration than the first semiconductor region and is adjacent to the second semiconductor region in a second direction orthogonal to the first direction;
a third electrode between the first electrode and the first semiconductor region;
a first insulating film between the first semiconductor region and the third electrode;
a fourth semiconductor region of the second conductivity type between the first semiconductor region and the first electrode;
a fifth semiconductor region of the first conductivity type between the fourth semiconductor region and the first electrode, and in contact with the first electrode; and
a sixth semiconductor region of the second conductivity type between the fourth semiconductor region and the first electrode region and in contact with the first electrode, and having a higher second conductivity type impurity concentration than does the fourth semiconductor,
wherein at least the portion of the fourth semiconductor region adjacent to the first insulating film has a smaller depth in the first direction than other portions of the fourth semiconductor region.

16. The semiconductor device according to claim 15, further comprising:
an eighth semiconductor region of the second conductivity type between the first electrode and the first semiconductor region;
a first element region comprising the second semiconductor region and the fourth semiconductor region; and
a second element region comprising the third semiconductor region and the eighth semiconductor region, wherein
the fifth semiconductor region is not between the eighth semiconductor region and the first electrode, and
the first element region and the second element region are directly adjacent to each other.

17. The semiconductor device according to claim 16, wherein a contact interface between the sixth semiconductor region and the eighth semiconductor region extends from the fourth semiconductor region to the first insulating film in the second direction.

18. The semiconductor device according to claim 15, wherein the second conductivity type impurity concentration of the second semiconductor region is greater than the second conductivity impurity type concentration of the fourth semiconductor region.

19. The semiconductor device according to claim 15, wherein the first conductivity type impurity concentration of the third semiconductor region is greater than the first conductivity impurity type concentration of the first semiconductor region.

20. The semiconductor device according to claim 15, wherein the sixth semiconductor region is in ohmic contact with the first electrode.

* * * * *